United States Patent
Lilienblum

(10) Patent No.: US 7,072,505 B2
(45) Date of Patent: Jul. 4, 2006

(54) METHOD OF DEFINING DEVIATIONS OF PIXEL POSITIONS

(75) Inventor: Tilo Lilienblum, Magdeburg (DE)

(73) Assignee: INB Vision AG, Magdeburg (DE)

(*) Notice: Subject to any disclaimer, the term of this patent is extended or adjusted under 35 U.S.C. 154(b) by 963 days.

(21) Appl. No.: 10/035,491

(22) Filed: Dec. 28, 2001

(65) Prior Publication Data

US 2002/0146165 A1 Oct. 10, 2002

(51) Int. Cl.
 *G06K 9/00* (2006.01)

(52) U.S. Cl. .................................... 382/154

(58) Field of Classification Search ......... 382/141–154
See application file for complete search history.

(56) References Cited

U.S. PATENT DOCUMENTS 5,852,671 A * 12/1998 Oshima ...................... 382/154
6,064,759 A * 5/2000 Buckley et al. ............. 382/154
6,424,382 B1 * 7/2002 Yoshida et al. ............. 348/607
6,674,404 B1 * 1/2004 Lee et al. .................... 348/275
6,816,187 B1 * 11/2004 Iwai et al. ................... 348/187

* cited by examiner

*Primary Examiner*—Joseph Mancuso
*Assistant Examiner*—Tom Y. Lu
(74) *Attorney, Agent, or Firm*—Collard & Roe, P.C.

(57) ABSTRACT

A method of defining deviations from a desired position of pixel sites in an image recording matrix by defining the 3-D data of a planar or slightly curved surface. To the extent necessary the results are smoothed, and the measuring points, utilizing the 3-D data, are projected back the sensors of the image recording matrix for determining the difference between the two points projected onto the sensors and associated with a 3-D measuring point. After selectively shifting the surface relative to the 3-D measuring system, prior method steps are repeated until the desired accuracy in the definition of the deviation has been has been attained.

7 Claims, 3 Drawing Sheets

METHOD OF DEFINING DEVIATIONS OF PIXEL POSITIONS

BACKGROUND OF THE INVENTION

1. Field of the Invention

The invention, in general, relates to a method of defining deviations of the position of pixels of at least one image recording matrix from a desired position. More particularly, the invention relates to defining such deviations of the position of pixels which are not taken into consideration during calibration of a 3-D measuring system. Where the desired position is known, the absolute position of the pixels can be defined on the basis of the deviation of the pixels from their desired position.

As used herein, "image recording matrix" connotes an arrangement capable of recording light intensity distributed over a surface and for reproducing it as a matrix. Examples of such arrangements are CCD sensors as well as CMOS sensors provided in cameras. Individual elements of the matrix are labeled "pixel". The "position of a pixel" will be referred to as "pixel site", the position of the pixel being defined by the center of the pixel. In an ideal image recording matrix the pixel sites are arranged in an ideal raster at a constant raster width. The pixel sites of such ideal image recording matrix are ideal pixel sites; their position will be termed "desired position".

2. The Prior Art

For taking into consideration deviations of the real or actual pixel raster from an ideal pixel raster it has been known to measure a reference measurement. For instance, the distance between two points may be measured by defining the centers of both points. Several pixels will have an impact in defining each center. In this manner, a possible error will be averaged out. The median distance between the pixels may thus be defined with great precision, since the overall error during definition of the centers remains constant and the relative error becomes smaller at an appropriate number of pixels.

Such errors are usually taken into consideration during calibration of a 3-D measuring system (see e.g. Luhmann, T.: Nahbereichsphotogrammetrie; Wichmann Verlag, Heidelberg). However, deviations of individual pixels from the ideal pixel raster are not detected in this manner.

The signal generated by a certain pixel may be defined as follows:

$$u = \int_A MTF(x, y) \cdot \Phi(x, y) dx dy$$

wherein µ designates the signal emitted by the pixel. MTF is the modulation transfer function as a function of the position (x,y) and φ is the light current/surface at position x,y. The integration surface A usually is larger than the surface of the pixel since electrons may diffuse across pixel borders from adjacent pixels. During mathematical processing of the signals is usually assumed that the intensity distribution corresponds to a Dirac-pulse in the center of the pixel.

A deviation of the position of the pixels of an image recording matrix from its desired position, i.e. an error in the pixel site, may be caused by several circumstances, two of which will be mentioned below:

1. The center of a pixel is shifted as a result of a deviation of the geometry of the light sensitive surface from the desired position.
2. Irregularities in the light sensitivity may cause the MTF to be non-symmetric and/or non-locally invariant. The center of gravity of the light intensity would thus be shifted as well. The effect of the deviation in the center of gravity is similar to a deviation of the geometry. The irregularity of the light sensitivity may be caused, for instance, by a deviation of the quantum efficiency.

Obviously, the fabrication of image recording matrices (e.g. CCD sensors) is sufficiently accurate to prevent errors at the pixel site from exerting any significant effect in most applications. The literature only rarely refers to inaccuracies in pixel positions. Thus, reference is made (see Theuwissen, A. J. P.: Solid State Imaging with Charge-Coupled Devices; Kluwer Academic Publishers) that irregularities in the geometry, thickness of the layers, degree of doping or doping profile exist and that they lead to irregularities of the pixels.

These irregularities are usually classified under such labels as PSFU (photo response non-uniformity) and DSNU (dark signal non-uniformity) (see Ratledge, D.: The Art and Science of CCD Astronomy; Springer Verlag 1997). The correction of PSFU and DSNU are known in the prior art. Indeed, integration of such correction is standard in some cameras.

Also, methods are known in which information about the real position of the pixels of an image recording matrix is important. This relates to methods of optical 3-D measurement by means of cameras. In such applications, even small deviations of the pixel site may lead to relevant errors in the calculated 3-D data. A special method in which errors in the calculated 3-D data is caused by errors of the pixel sites is the subject of German patent application DE 196 23 172 C1.

Scanning the image recording matrix by a laser is one way of defining the pixel sites. For each point scanned by the laser it is possible to define the light sensitivity at this point and the pixel to which the point is associated. Hence, it is possible to define the MTF for each pixel.

However, the financial and technical outlay for equipment for laser scanning of image recording matrices necessary for 3-D measurements by cameras is too high for many users.

OBJECT OF THE INVENTION

It is, therefore, an object of the invention to provide for an economically viable method of defining the real pixel site of an image recording matrix or of the deviations between the real pixel sites and the ideal pixel sites without the necessity of a laser scanner.

SUMMARY OF THE INVENTION

In the accomplishment of this and other objects, the invention provides for alternative methods the steps of which will be described in greater detail hereinafter.

In accordance with the invention, the accuracy of the results generally increases by repeating at least some of the steps of the method.

Hereinafter, "3-D measuring points" will be understood to refer to measuring point on the surface of the object used in accordance with the invention, and their coordinates will be referred to as 3-D data".

Knowledge of the pixel site error makes it possible
to define the real pixel site. Thus the correct data may be
utilized in methods which rely upon the real pixel site
to yield maximum accuracy.
in methods which proceed from an ideal pixel site to
broaden the measurement such that errors at the pixel
site will be taken into consideration, leading to an
increased field of application and/or to improved accuracy of such methods.

The object to be used in connection with the method of the invention has to satisfy the basic condition of being suitable for measuring by means of a 3-D measuring system. Moreover, it is necessary that an object be used which is either planar or curved such that by smoothing the 3-D data of the objects only leads to elimination of the local errors of the 3-D data only and not to a change in the contours of the object. Local errors are to be understood to be such as the statistical measurement uncertainty, for instance. This error is distinguished from the global error, i.e. the absolute error of the measured 3-D coordinates of the world coordinate system. Any expert will be able on the basis of these data to defined suitable concrete objects. In particular, the expert knows that the surface of the object used must not be of a roughness relevant to the result.

In a preferred embodiment of the invention, the shift between the object and the 3-D measuring system preferably occurs in the direction of the surface normal of the object which usually points in the direction of the z-axis of the 3-D measuring system. However, the alignment of the surface normal of the object in the direction of the z-axis of the 3-D measurement system is not a necessary condition for practicing the method in accordance with the invention.

Other objects will in part be obvious and will in part appear hereinafter.

DESCRIPTION OF THE SEVERAL DRAWINGS

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:

DETAILED DESCRIPTION OF THE PREFERRED EMBODIMENTS

If 3-D data of measuring points on a surface of an object are defined by means of the 3-D measuring method in accordance with German patent specification DE 196 23 172, the will suffer from inherent errors. One source of errors resides in the errors of the pixel sites.

Figure 1:
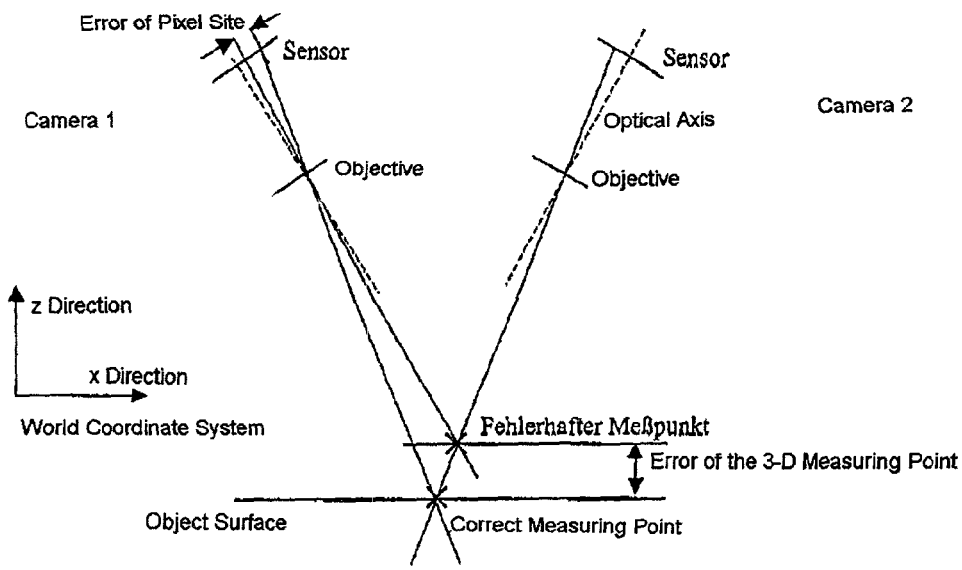
FIG. 1 depicts the effects of an error in the pixel site on calculated 3-D data.

FIG. 1 illustrates the effect of the error of a pixel site of an image recording matrix on the result of a measurement. The view is taken from the direction of the y-axis toward the xz plane. Accordingly, in this figure there is illustrated only one error of the pixel site in the x or z direction of the world coordinate system.

Analogous connections result from a view in the x direction toward the yz plane.

Definition of the error of the 3-D data of the 3-D measuring point:

The error of the 3-D data of a predetermined measuring point is calculated by forming the difference between the measured erroneous 3-D data and the correct 3-D data of the measuring point.

The correct 3-D data may be defined in the manner to be described hereinafter if a planar or slightly curved surface of the following properties is being measured:

The surface should not have any roughness relevant to the result. Too great a roughness leads to an erroneous result in calculating the exact pixel site.

The surface need not be an ideal plane. However, any curvature must not be too large.

The data resulting from the 3-D measurement are then smoothed. In the present context, smoothing connotes:

Filtering with a linear or non-linear local smoothing operator. For this purpose the x and y coordinates of the individual measuring points are to be located in an equidistant raster. In this manner, the z coordinates may be arranged in a matrix, and this matrix may be thought of as an image. Smoothing such an image is well-known.

An approximation of the 3-D data. The approximation function (e.g., a Splines surface) must be constituted such it provides for a sufficient smoothing effect.

Since the measuring object is not strongly curved (if it were, smoothing would alter its curvature), this method results in correct 3-D data of the measuring point. By forming the difference, the error may be defined as mentioned supra. Instead of proceeding on the basis of FIG. 1, it would also be possible to proceed from the geometric relations depicted in FIG. 2 in order to calculate the correct 3-D data of a measuring point.

Calculating the error of the pixel site from the measuring error:

According to FIG. 1 the error of the pixel site may be calculated on the basis of the error of the 3-D data of the 3-D measuring point. The projection of a point from the world coordinate system into the image is accomplished as follows:

$$\bar{p}_k = R(\bar{p} - \bar{p}_l)$$

$$x_{sensor} = \frac{C_x p_{kx}}{p_{kz}}$$

$$y_{sensor} = \frac{C_y p_{ky}}{p_{kz}}$$

where $$\bar{p}_k = \begin{bmatrix} p_{kx} \\ p_{ky} \\ p_{kz} \end{bmatrix} = \text{Measuring point in the camera coordinate system (in mm)}$$

$\bar{p}$=Measuring point (in mm)
$\bar{p}_r$=Position of the camera coordinate system (in mm)
R=Rotation matrix (Position of the camera coordinate system)
$x_{sensor}$=x Position on the sensor (in the pixel)
$y_{sensor}$=y Position on the sensor (in the pixel)
$C_x$, $C_y$=Focal length in the x or y direction (in the pixel).

The x and y positions on the sensor can now be calculated for the correct 3-D data and the erroneous 3-D data of the relevant measuring point. The difference between the sensor positions determined in this manner corresponds to the error of the pixel site at the corresponding position of the sensor.

Figure 2:
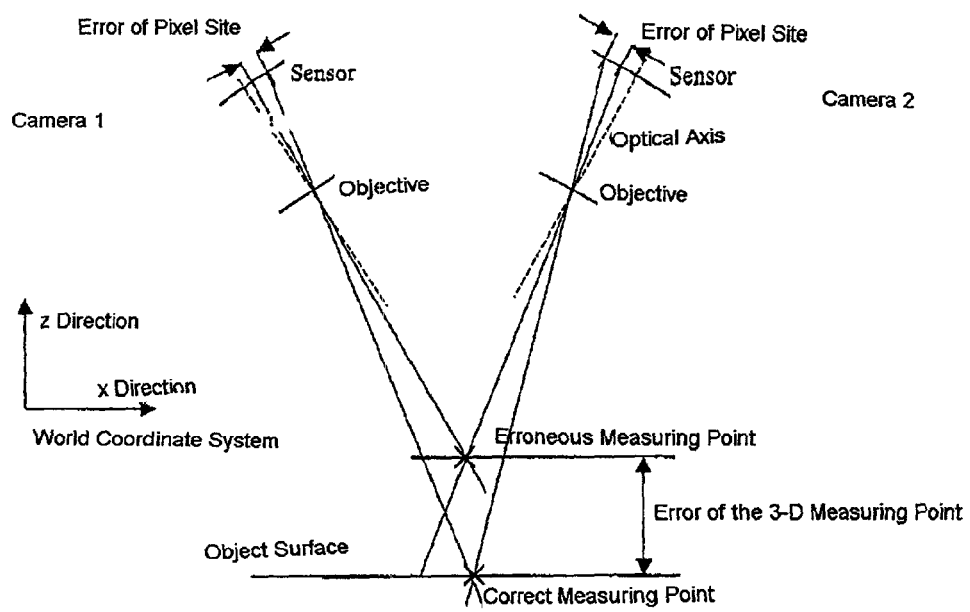
FIG. 2 depicts the effects of an error in the pixel site in two cameras on the 3-D data.

Problem of the ambiguity:

There are different ways of calculating the error of the pixel site on the basis of the 3-D data of a measuring point. In FIG. 1 it is assumed that the error occurs in one sensor only. The assumption in FIG. 2 is that the errors of the two sensors complement each other. In either possibility the calculation cannot be unambiguous as it is not known which camera is the cause of the measuring error.

Solving the problem of the ambiguity of the calculated errors:

This measurement is carried out several times. Following each measurement the measuring object is shifted, if possible, in the direction of its surface normal which in this case coincides with the z direction.

Figure 3:
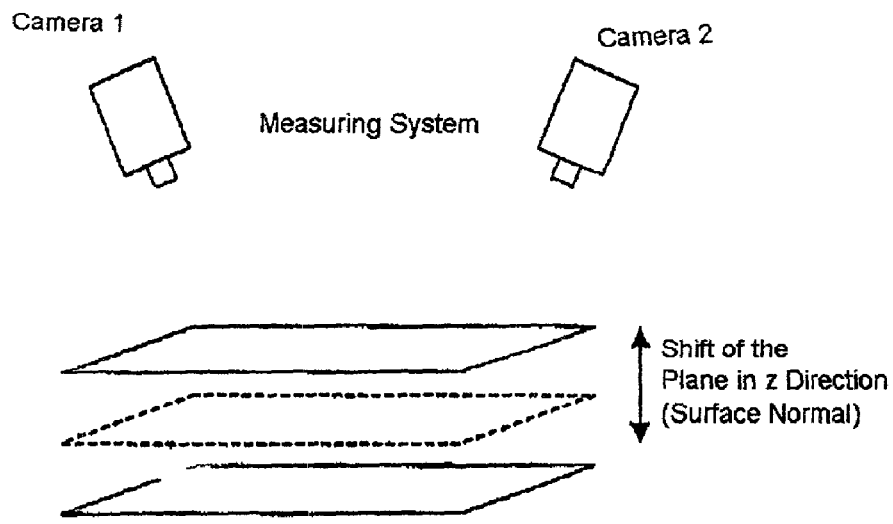
FIG. 3 depicts the shift of the planar object in the direction of the surface normal (z-axis)

FIG. 3 illustrates the approach. During each back projection of the measuring point it is different pixels of the image recording matrix which are combined with each other.

For each individual measurement an error of the pixel site may thus be defined in a different way. For instance, it may be assumed that it is only one image recording matrix which causes the error. The error of the pixel site must thus be calculated separately for all image recording matrices.

both (or all) image recording matrices cause the error.

Thereafter an averaged result is calculated on the basis of all measurements. The calculated error of a predetermined pixel site of a predetermined image recording matrix thus results from the following error sources:

true error of the corresponding pixel. This is an error which uniformly occurs in all measurements and will not be reduced by the averaging.

error of the corresponding pixel on the other image recording matrix. Since the corresponding pixel changes at each individual measurement, this error would be reduced by the averaging.

other error sources, e.g. noise. These error sources would also be reduced by averaging.

Figure 4:
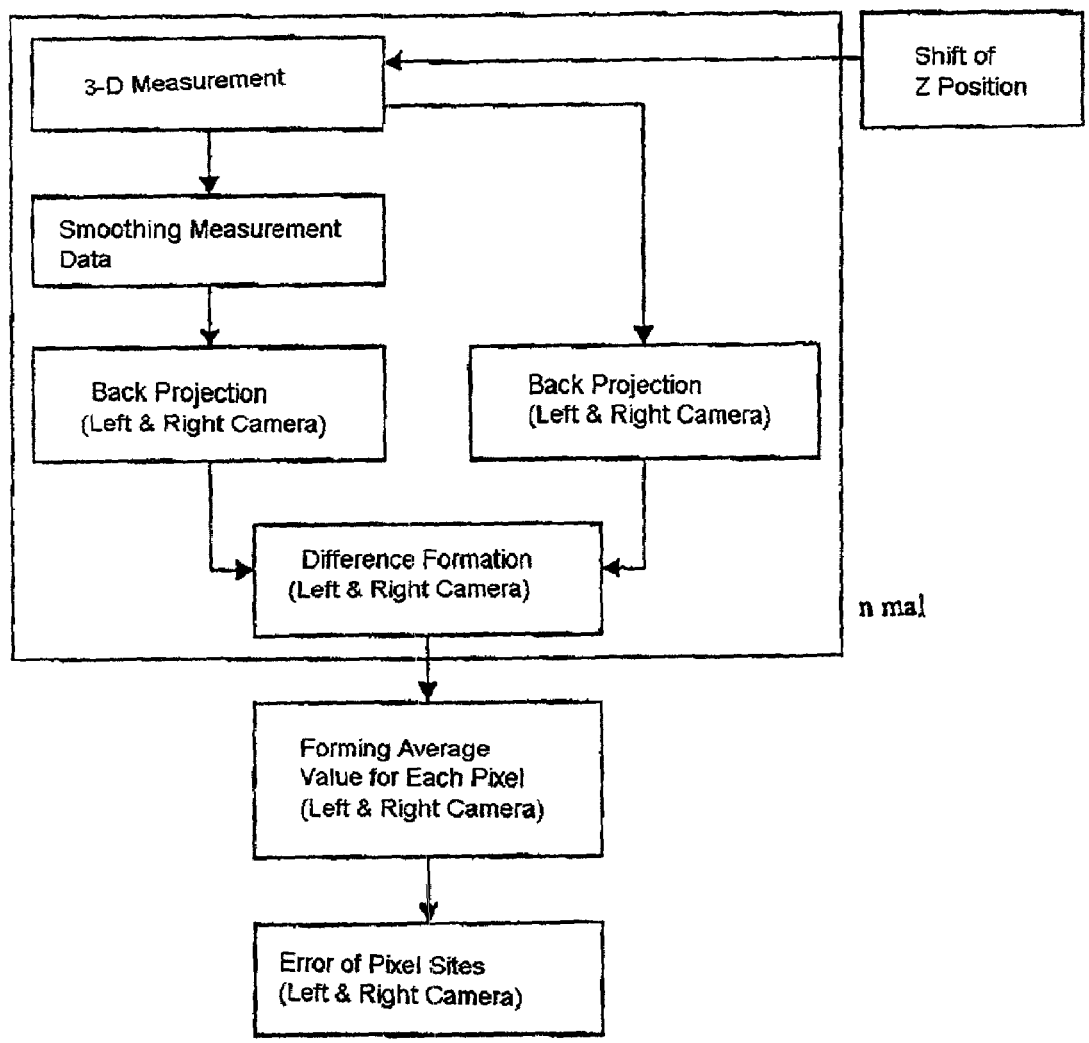
FIG. 4 schematically depicts a structural plan of the invention.

By averaging sufficient measurements the error of the pixel site may be calculated for each image recording matrix and for each pixel. FIG. 4 illustrates the approach of calculating the error in accordance with FIG. 2.

The error of a predetermined pixel of a camera will always occur at the same position. The influence exerted by the error of the corresponding other pixels always occurs at another position (is always combined with another pixel) and disappears as a result of the averaging. The formation of an average value for each pixel may be accomplished, for instance, by forming the average value of all calculated errors which may be associated with a predetermined pixel.

Reasonably, the definition of measuring points is carried out at a higher density than the density of the associated pixels. The starter base for forming average values would thus be a relatively dense cloud of points. This leads to a more exact result following the average value formation. The cloud of points may, of course, also be approximated by a function, such as, for instance, the Spline approximation.

The final result is a matrix which offers two values for each pixel, i.e. one error of the pixel site in the x direction and one error in the y direction.

What is claimed is:

1. A method of defining the deviation of a pixel site of pixels of at least one image recording matrix from a desired position, comprising the steps of:
    a) integrating the image recording matrix into an optical 3-D measuring system at least while the method is being practiced;
    b) making an object available which is suitable for being measured by a 3-D measuring system, the object being either planar or curved such that during smoothing, only local errors of the 3-D data are without making changes to the contours of the object;
    c) measuring the object by a 3-D measuring system for determining the 3-D data of the object;
    d) smoothing the determined 3-D data of the object;
    e) projecting 3-D measuring points back to sensors of at least one matrix camera utilizing the determined and the smoothed 3-D data;
    f) determining the difference between the positions of the two points projected back to the sensors, said two points being associated with a 3-D measuring point;
    g) selectively shifting the object relative to the 3-D measuring system;
    h) repeating steps b) through g) until the desired accuracy of the deviations to be determined by the method of the pixel site of pixels of an image recording matrix has been attained, the accuracy being a function of the repetitions and the number of shifts; and
    i) defining the deviation of the pixel site of the pixels from the desired position from the values determined by step f) for one of each pixel and selected pixels.

2. The method of claim 1, wherein the shifting between object and measuring system is carried out substantially in the direction of the surface normal of the object.

3. The method of claim 1, wherein the deviation of the pixel site of the pixels from the desired position is determined by defining for each pixel the error of the pixel site by forming an average value of the values determined in step f) and relevant to the given pixel.

4. The method of claim 1, wherein the deviation of the pixel site of the pixels from the desired position is determined by approximating by a function for each pixel the error of the pixel site by forming an average value of the values determined in step f).

5. The method of claim 1, wherein the image recording matrix comprises COD sensor means.

6. The method of claim 1, wherein the image recording matrix comprises CMOS sensor means.

7. The method of claim 1, wherein the described position is defined by calibration of the measuring system.

* * * * *

UNITED STATES PATENT AND TRADEMARK OFFICE
CERTIFICATE OF CORRECTION

| | | |
|---|---|---|
| PATENT NO. | : 7,072,505 B2 | Page 1 of 1 |
| APPLICATION NO. | : 10/035491 | |
| DATED | : July 4, 2006 | |
| INVENTOR(S) | : Lilienblum | |

It is certified that error appears in the above-identified patent and that said Letters Patent is hereby corrected as shown below:

On Title Page, column 1, item (30), please add the Claim of Priority of the Foreign Application Priority data to correctly read as follows:

-- Dec. 28, 2000     (DE) ………….. 100 65 120.8-52--.

Signed and Sealed this

Fifth Day of December, 2006

JON W. DUDAS
*Director of the United States Patent and Trademark Office*